United States Patent
Kuragaki

(12)
(10) Patent No.: US 6,258,163 B1
(45) Date of Patent: Jul. 10, 2001

(54) METHOD FOR PRODUCING SILICON SINGLE CRYSTAL

(75) Inventor: Shunji Kuragaki, Nishinomiya (JP)

(73) Assignee: Sumitomo Metal Industries, Ltd., Osaka (JP)

( * ) Notice: Subject to any disclaimer, the term of this patent is extended or adjusted under 35 U.S.C. 154(b) by 0 days.

(21) Appl. No.: 09/392,299

(22) Filed: Sep. 8, 1999

(30) Foreign Application Priority Data

Sep. 8, 1998 (JP) .................................................. 10-254168

(51) Int. Cl.$^7$ ...................................................... C30B 15/00
(52) U.S. Cl. ........................................................... 117/30
(58) Field of Search ................................ 117/30, 32, 917

(56) References Cited

U.S. PATENT DOCUMENTS 5,349,921 * 9/1994 Barnaclough et al. ............... 117/13
5,868,832 * 2/1999 Begg ..................................... 117/32

FOREIGN PATENT DOCUMENTS

| | | |
|---|---|---|
| 58-217493 | 12/1983 | (JP) . |
| 61-222984 | 10/1986 | (JP) . |
| 63-248793 | 10/1988 | (JP) . |
| 1-282185 | 11/1989 | (JP) . |
| 3-505442 | 11/1991 | (JP) . |
| 5-194077 | 8/1993 | (JP) . |
| 7-61893 | 3/1995 | (JP) . |
| 10114597A | * 5/1998 | (JP) . |

* cited by examiner

Primary Examiner—Felisa Hiteshew
(74) Attorney, Agent, or Firm—Armstrong, Westerman, Hattori, McLeland & Naughton LLP

(57) ABSTRACT

A method for producing a high-quality silicon single crystal in which oxygen distribution, with respect to the growth and radial directions, is made uniform. The invention provides a magnetic Czochralski method involving pulling a single crystal while a cusp magnetic field is applied, the intensity of the cusp magnetic field and a mid-field position existing between upper and lower coils being held constant during pulling of a main body of the single crystal, having a diameter corresponding to that of a wafer product; said mid-field position being set at a specific range defined in terms of the surface level of a melt. Preferably, the cusp magnetic field held constant during a pulling step has an intensity of 300 G to 600 G; the mid-field position is set at −40 mm to −100 mm from the surface level of a melt; and the mid-field position is set at −7% to −18% from the surface level of the melt as normalized with respect to the inner diameter of a crucible. The rotation rate of a crucible may be held constant during the pulling step.

14 Claims, 4 Drawing Sheets

METHOD FOR PRODUCING SILICON SINGLE CRYSTAL

BACKGROUND OF THE INVENTION

1. Field of the Invention

The present invention relates to a method for producing a silicon single crystal through the magnetic Czochralski method, and more particularly, to a method for producing a high-quality silicon single crystal, in which a cusp magnetic field is symmetrically applied to the pulling axis, so as to regulate the oxygen distribution in the single crystal, such that oxygen distribution is uniform with respect to the growth direction, i.e., the axial direction, and to prevent generation of dislocations formed during the crystal growth.

2. Background Art

To a silicon single crystal used in the production of an ultra-large scale integration semiconductor devices, there is applied a gettering technique in which oxygen contained in the single crystal is deposited as an oxide and heavy metal impurities causing deterioration of the yield of the devices are gettered by the oxide contained in the vicinity of a wafer surface. Attaining uniform distribution of oxygen contained in a single crystal is an important factor for attainment of the sufficient gettering performance.

Conventionally, there have been employed several methods in which the rotation rate of a crucible is modified as a silicon crystal grows so as to regulate the oxygen distribution within the crystal. Although these methods achieve a reduction in oxygen concentration as the pulling of the single crystal progresses, generation of high oxygen concentration in a top portion of the crystal immediately after initiation of pulling is difficult to prevent. Therefore, the above methods provide single crystal products that fail to meet standards for oxygen concentration, and thereby disadvantageously deteriorate the yield of the products.

Recently, the standard for oxygen concentration required for a semiconductor device substrate has become more strict corresponding to the enhancement of a functionality of the device, and overcoming the above problems through the above methods has become increasingly difficult. In addition, generation of dislocations in a single crystal, during a pulling step, tends to increase when pulling is carried out in the recently introduced large-scale apparatus for producing a single crystal. In order to cope with the problem of an occurrence of dislocations, a variety of methods involving application of a DC-induced magnetic field to a melt during pulling, have been investigated.

Meanwhile, the effect of an application of a magnetic field on a generation of dislocations in a single crystal during a pulling step is based on suppression of convection in a melt, through application of a magnetic field to the melt. The suppression of convection suppresses incorporation of quartz released from the inner surface of a crucible into the melt, to thereby prevent generation of dislocations in a single crystal during crystal growth (HOSHIKAWA et al., Journal of Applied Physics, 60, 808, 1991). The effect also prevents deterioration of a quartz crucible, to thereby possibly prolong the service life thereof.

Among the methods for applying a magnetic field to a melt, attention has been drawn to a method involving application of an axially-symmetrical and radial cusp magnetic field to a melt in a crucible. According to this method, a pair of magnets through which cicular currents are induced in opposite directions are disposed above and below the melt. As a result, at the position halfway between the two magnetic fields, along the growth axis (hereinafter referred to as "mid-field position"), the magnetic fields cancel each other out to make a vertical magnetic field component zero and to form a radial horizontal magnetic field. The radial cusp magnetic field restrains the flow of the melt, to thereby stabilize the melt. In other words, application of a radial cusp magnetic field induces convection at a portion adjacent to the solid-liquid interface at which crystal growth occurs, and suppresses convection at the remaining portions of the melt, to thereby serve as an effective method for realizing uniform oxygen distribution.

Conventionally, based on the above method involving application of a cusp magnetic field, there have been disclosed a variety of methods for producing a single crystal having a uniform compositional profile. For example, Japanese Patent Application Laid-Open (kokai) No. 5-194077 discloses a magnetic Czochralski method for producing a silicon single crystal, involving application of a cusp magnetic field to a crystal in which the rotation rate of a crucible increases and the intensity of the magnetic field decreases, as the fraction of a solidified silicon melt increases after establishment of the rod diameter of a single crystal.

In the above method, the crystal rod to be pulled and the crucible are rotated in opposite directions, and during growth of a single crystal the rotation rate of the crystal rod is greater than that of the crucible. The rotation rate of the crucible increases as the crystal rod is pulled. A magnetic field is applied to a melt in the crucible so as to provide a component perpendicularly intersecting the bottom and side walls. The intensity of the magnetic field and the component perpendicularly intersecting the bottom and side walls decrease as a single crystal grows. After approximately 50–80% of the fed melt is solidified, application of the magnetic field is stopped. Thereafter, the concentration of oxygen in the single crystal is controlled by increasing the rotation rate of the crucible to the rotation rate of the crystal rod.

This method provides a measure against high oxygen concentration in a top portion of the crystal that is difficult to attain through a method not involving application of a magnetic field, and improves initial oxygen concentration and the distribution thereof. However, effect on prevention of dislocations through application of a magnetic field is poor, since the intensity of the magnetic field decreases and eventually reaches zero. Therefore, the yield of a product is lowered by dislocations, and an effect for greatly prolonging the service life of a crucible, by preventing deterioration of a quartz crucible, is not fully attained. In addition, disadvantageously, the radial distribution of oxygen is not uniformly regulated, since the rotation rate of the crucible increases as the single crystal is pulled to thereby cause a considerable decrease in oxygen concentration at the periphery of the crystal rod.

Japanese Patent Application Laid-Open (kokai) No. 7-61893 discloses a method for growing a single crystal having a uniform distribution of oxygen in which the intensity of the magnetic field applied during crystal growth is regulated by setting a magnet number. In this case, the convection in a melt is regulated to an axially-symmetrical flow without the convection being completed. Briefly, mass transfer in the melt contained in a crucible is not in a diffusion-control mode which is realized by the convention-suppressing effect of a magnetic field, but rather a "controlled convection" is formed without development of vortexes. As a result, oxygen is uniformly incorporated in the growth and radial directions, to thereby produce a silicon single crystal having a uniform oxygen distribution with respect to all directions.

In order to confirm the effects of the above-disclosed method for growing a single crystal, the present inventors have conducted growth of an 8-inch silicon single crystal in a hot-zone by use of a quartz crucible having a diameter of 560 mm. However, no actual effects have been confirmed. In other words, conditions for growth employed in the above-disclosed method are established under very specific restrictions, such as use of a small-diameter crucible. In addition, measurement of convection in a melt employed in this method is considerably complex and requires a great deal of work in consideration of the actual operation. Thus, the method disclosed in Japanese Patent Application Laid-Open (kokai) No. 7-61893 cannot be employed as a generally accepted method for producing a single crystal.

SUMMARY OF THE INVENTION

In view of the foregoing, the present invention has conceived in order to regulate the above-described oxygen distribution in a single crystal to thereby overcome the problems in a magnetic Czochralski method involving application of a cusp magnetic field. Therefore, the objective of the present invention is to provide a method for producing a silicon single crystal, having excellent uniform radial and axial oxygen distribution, by means of setting a mid-field position at a certain level under the surface level of a melt and preventing generation of dislocations during crystal growth.

The present inventors have conducted earnest studies on the methods, and have found that the oxygen distribution in the axial direction can be made uniform by maintaining a mid-field position at a certain level under the surface level of a melt in which perpendicular magnetic fields cancel each other, even though the intensity of the cusp magnetic field is held to be constant during pulling of the main body of the single crystal. The present inventors have also found that employment of the cusp magnetic field of constant intensity during a pulling step prevents generation of dislocations during growth and greatly extends the service life of a crucible, and that the constant rotation rate of the crucible, i.e., a rate which is not increased as the single crystal is pulled, attains uniform oxygen distribution with respect to the radial direction. The present invention has been accomplished based on this finding.

Accordingly, the first aspect of the present invention is to provide a method for producing a silicon single crystal by use of a magnetic Czochralski method which involves pulling a single crystal while a cusp magnetic field is applied, wherein:

the intensity of the cusp magnetic field and mid-field position existing between upper and lower coils are held constant during the pulling of a main body of the single crystal having a diameter corresponding to that of a wafer product; and said mid-field position is set at a specific range from the surface level of a melt.

A second aspect of the present invention is to provide a method for producing a silicon single crystal by use of a magnetic Czochralski method which involves pulling a single crystal while a cusp magnetic field is applied, wherein:

the intensity of the cusp magnetic field and mid-field position existing between upper and lower coils are held constant during the pulling of a main body of the single crystal having a diameter corresponding to that of a wafer product;

said mid-field position is set at a specific range from the surface level of a melt; and the variation in oxygen concentration is $1.0 \times 10^{17}$ atoms/$cm^3$ or less.

A third aspect of the present invention is to provide a method for producing a silicon single crystal by use of a magnetic Czochralski method which involves pulling a single crystal while a cusp magnetic field is applied, wherein:

the intensity of the cusp magnetic field and mid-field position existing between upper and lower coils are held constant during the pulling of a main body of the single crystal having a diameter corresponding to that of a wafer product;

said mid-field position is set at a specific range from the surface level of a melt; and coils for generation of a magnetic field are disposed opposite to each other above and below the crucible, so as to apply along the pulling axis an axially-symmetrical cusp magnetic field to a melt contained in the crucible.

Preferably, in any of the above three aspects, the mid-field position is set at −40 mm to −100 mm from the surface level of the melt; the mid-field position is set at −7% to −18% from the surface level of the melt as normalized with respect to the distance to the inner diameter of a crucible containing the melt; the cusp magnetic field is held constant during a pulling step to have an intensity of 300 G to 600 G; and the rotation rate of a crucible containing the melt is held constant during the pulling step.

In the present invention, an axially-symmetrical cusp magnetic field is applied along the pulling axis to a melt contained in a crucible while a center axis penetrating the oppositely disposed coils for a generation of a magnetic field is matched with the pulling axis. Application of the magnetic field may be limited to only during the pulling of the main body of the single crystal having a diameter corresponding to that of a wafer product, and the application may be omitted during formation of a necking and shoulder portions of the single crystal.

In the present invention, the intensity of a cusp magnetic field is defined as the intensity of a vertical magnetic field intersecting a side wall of a crucible at a mid-field position. The reference for the mid-field position is the level of a melt, and the sign "−" stands for a level below the surface. Thus, "−40 mm" stands for a level 40 mm below the surface of a melt, and "−7%" stands for a level below the surface of a melt such that the ratio of the level to the inner diameter of a crucible is −7%.

BRIEF DESCRIPTION OF THE DRAWINGS

Various other objectives, features, and many of the attendant advantages of the present invention will be readily appreciated as the same becomes better understood with reference to the following detailed description of the preferred embodiments when considered in connection with accompanying drawings, in which.

DETAILED DESCRIPTION OF PREFERRED EMBODIMENTS

Figure 1:
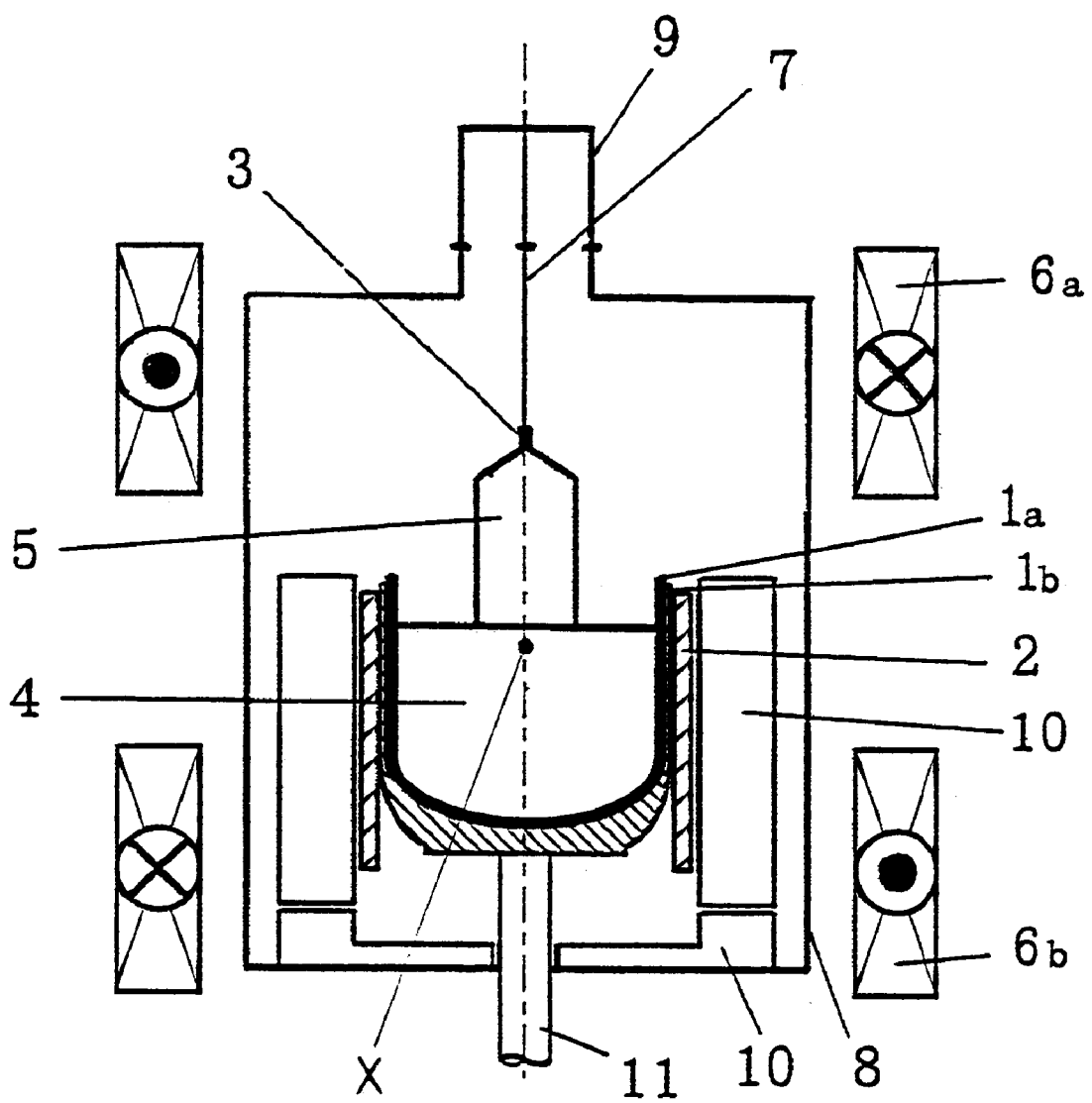
FIG. 1 is a schematic view of an apparatus employed in a method for producing a silicon single crystal according to the present invention.

FIG. 1 is a schematic view of an apparatus employed in a method for producing a silicon single crystal according to the present invention. Polycrystalline Silicon, a raw material for a single crystal, is maintained in a crucible 1 in a molten state. A seed crystal 3 is brought into contact with the surface of a melt 4 while being rotated, and is pulled up at a rate in accordance with a solidification rate of the growing crystal, to thereby grow a single crystal 5 of a predetermined diameter. A quartz crucible 1a containing a melt, inserted into a graphite crucible 1b provided for outside support, can rotate freely about a rotation axis 11 while a center axis of the crucible 1 is matched with a pulling axis and can also move upward and downward. In the upper part of the crucible 1 and along the center axis thereof, there is provided a pulling apparatus 7 comprising a wire for pulling. A heater 2 and a thermal insulator 10 are disposed concentrically with and outside the crucible 1. The entirety of the apparatus is contained in an airtight chamber 8 and a pull-chamber 9.

A pair of oppositely facing coils 6 for generating a magnetic field are disposed above and below the crucible 1. When currents flow in two different directions through a pair of coils 6a and 6b, a cusp magnetic field is formed in a melt 4 contained in the crucible. In FIG. 1, the symbol "·" stands for the flow of current out of the sheet and the symbol "×" stands for the flow of current into the sheet.

Through such a constitution of coils 6 for generating a magnetic field, the magnetic fields cancel each other to make a vertical cusp magnetic field component zero at a mid-field position X. A vertical magnetic field still remains and a radial horizontal magnetic field is formed at positions other than the mid-field position X.

The relation between oxygen distribution with respect to the growth direction corresponding to the mid-field position and the intensity of a cusp magnetic field was investigated over a wide range by use of the apparatus for producing a single crystal shown in the FIG. 1. The results reveal that the oxygen distribution within a single crystal can be regulated to be made uniform with respect to the growth direction by appropriately setting the mid- field position in accordance with the surface level of a melt even when the intensity of the cusp magnetic field is maintained constant during the pulling step.

Briefly, by setting the mid-field position at a predetermined range from the surface level of a melt, the magnetic field applied to the melt can be adjusted and the oxygen distribution of a single crystal can be made uniform from initiation to termination of the pulling step. Conventionally, the effect of a magnetic field applied to a melt has been known to regulate dissolution of oxygen from a quartz crucible and evaporation of oxygen from the surface of the melt. Specifically, the component of a magnetic field perpendicularly intersecting the surface of a melt prevents evaporation of oxygen, and that perpendicularly intersecting the inner wall of a quartz crucible prevents dissolution of oxygen. Application of the components of the magnetic field simultaneously provides an effect on the viscosity of the melt, to thereby regulate convection within the melt. Thus, by adjusting the mid-field position, one component of the magnetic field intersects the surface of the melt, while the other component intersects the inner wall of a quartz crucible, and the intensity of the cusp magnetic field provides an effect on convection in a melt which can be regulated arbitrarily, to thereby realize constant regulation of the oxygen distribution with respect to the growth direction.

In order to confirm the above-described range for adjustment of the mid-field position, 110kg of polycrystalline silicon was melted in a quartz crucible having an effective inner diameter of 560 mm, to thereby produce a silicon single crystal having a diameter of 8 inches. A pulling step was carried out under the following conditions: a crystal rotation rate of 12 rpm; a crucible rotation rate of 6 rpm; a chamber pressure of 25 Torr; and an Ar flow rate of 30 l/minute. The intensity of a cusp magnetic field during the pulling step was held constant within a range of 300 G to 600 G. As described above, the intensity of a cusp magnetic field refers to the intensity of a horizontal magnetic field at the level of a mid-field position.

Figure 2:
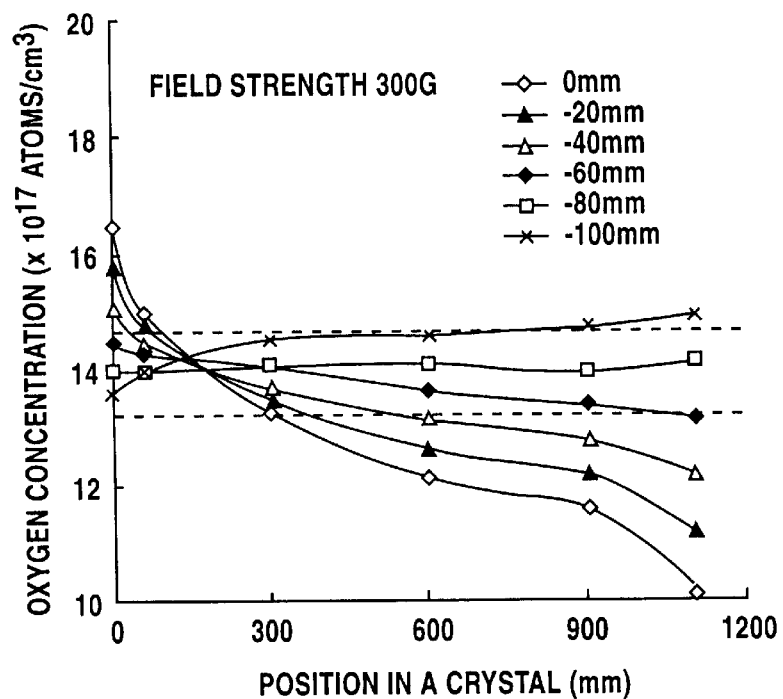
FIG. 2 shows the relation between a mid-field position and oxygen distribution with respect to the axial direction when a cusp magnetic field is applied during a pulling step at a constant intensity of 300 G.
Figure 3:
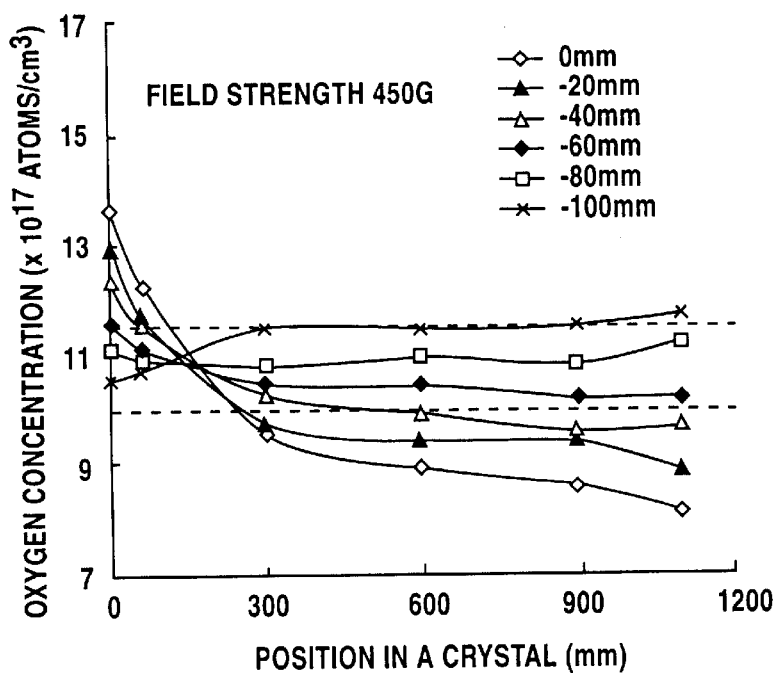
FIG. 3 shows the relation between a mid-field position and oxygen distribution with respect to the axial direction when a cusp magnetic field is applied during a pulling step at a constant intensity of 450 G.
Figure 4:
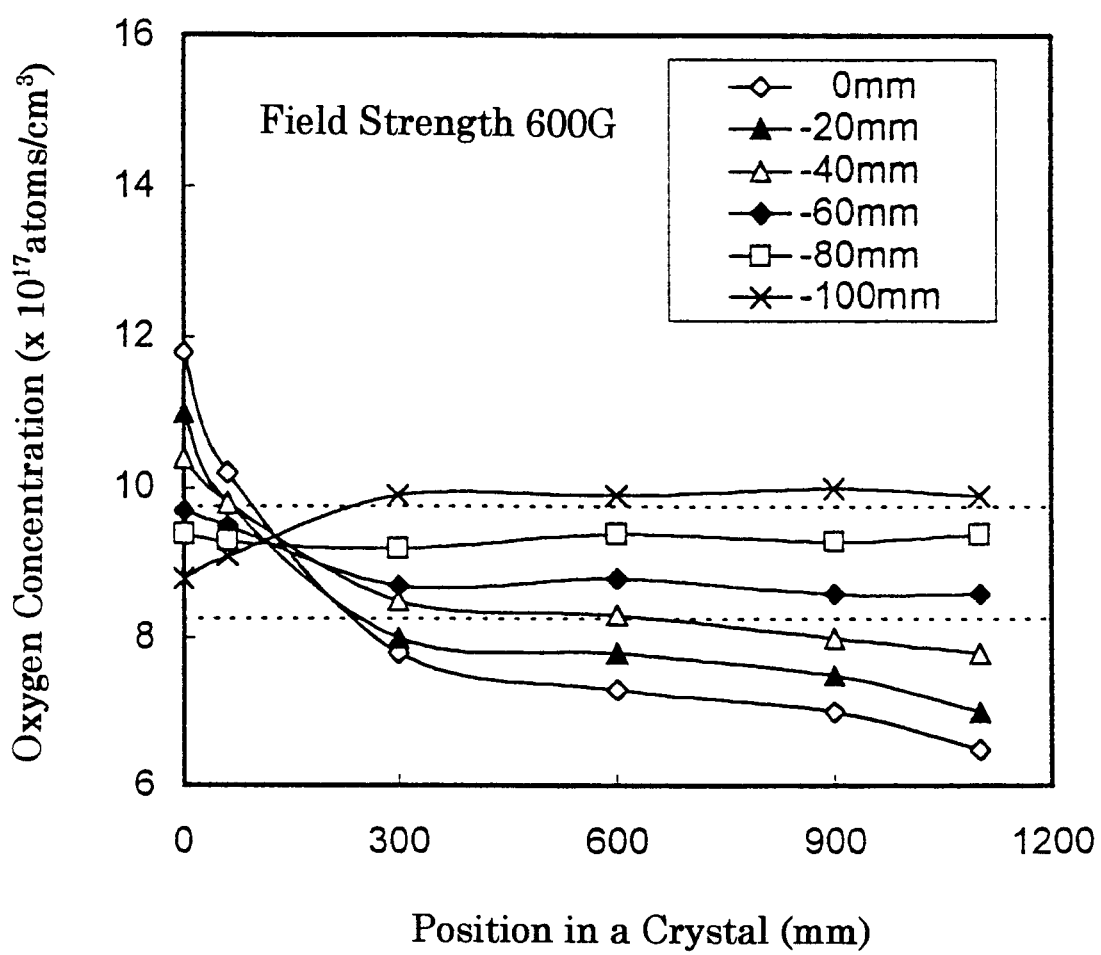
FIG. 4 shows the relation between a mid-field position and oxygen distribution with respect to the axial direction when a cusp magnetic field is applied during a pulling step at a constant intensity of 600 G.

FIGS. 2 to 4 show the relation between mid-field position and oxygen distribution with respect to the axial direction when a cusp magnetic field is applied during a pulling step at a constant intensity. The mid-field position is set from the surface level of a melt (0 mm) to −100 mm.

In FIG. 2, the intensity of a cusp magnetic field is held constant at 300 G. The standard oxygen concentration is $14 \times 10^{17}$ atoms/cm$^3$, and the target variation in concentration is $1.0 \times 10^7$ atoms/cm$^3$ or less. In FIG. 3, the intensity of a cusp magnetic field is held constant at 450 G. The standard oxygen concentration is $10.7 \times 10^{17}$ atoms/cm$^3$, and the target variation in concentration is $0.5 \times 10^{17}$ atoms/cm$^3$ or less. In FIG. 4, the intensity of a cusp magnetic field is held constant at 600 G. The standard oxygen concentration is $9 \times 10^{17}$ atoms/cm$^3$, and the target variation in concentration is $0.5 \times 10^{17}$ atoms/cm$^3$ or less. Although device-makers usually demand an oxygen concentration in a single crystal of $(9-14) \times 1017$ atoms/cm$^3$, variation in concentration must be regulated to $1.0 \times 10^{17}$ atoms/cm$^3$ or less in consideration of product yield and specifications.

As is clear from FIGS. 2 to 4, the mid-field position is preferably set at −40 mm to −100 mm from the surface level of a melt, more preferably at −60 mm to −80 mm. When the position is defined in terms of a ratio to the dimension of an employed crucible, the mid-field position is preferably set at −7% to −18% based on the inner diameter of the crucible.

Optimum conditions assumed from the results of FIGS. 2 to 4 are summarize=ed in the following Table 1. Specifically, Table 1 shows the mid-field position where oxygen distribution with respect to the axial direction is most uniform under a constant intensity of a cusp magnetic field, and a standard oxygen concentration.

TABLE 1

| Conditions | Magnetic field intensity G | *Mid-field position *1)A mm | *2)B % | Oxygen Concentration ×10$^{17}$ atoms/cm$^3$ |
|---|---|---|---|---|
| 1 | 300 | −80 | 14 | 14 |
| 2 | 450 | −75 | 13 | 10.7 |
| 3 | 600 | −70 | 12.5 | 9 |

*)Mid-field position represents a distance from the surface level of a melt.
*1) *2)"A" represents a distance (mm) and "B" represents a ratio distance (mm)/inner diameter of crucible (mm)) %.

As is dear from Table 1, oxygen distribution can be made uniform through the method for producing a single crystal according to the present invention when the oxygen concentration is within the range of 9×10$^{17}$ atoms/cm$^3$ to 14×10$^{17}$ atoms/cm$^3$. In addition, the method is more effective for preventing dislocations in a single crystal than is a conventional method, in that the intensity of a cusp magnetic field is not necessarily modified during a pulling step.

EXAMPLES

The present invention will next be described by way of example, which should not be construed as limiting the invention thereto. Working Example of the Present Invention By use of an apparatus shown in FIG. 1, 110 kg of polycrystalline silicon was melted in a quartz crucible having an effective inner diameter of 560 mm, to thereby produce a silicon single crystal having a diameter of 8 inches. A pulling step was carried out under the following conditions: a crystal rotation rate of 12 rpm; a crucible rotation rate of 6 rpm; chamber pressure of 25 Torr; and an Ar flow rate of 30 l/minute. The intensity of a cusp magnetic field during the pulling step was held constant at 500 G, and the mid-field position was maintained constant at −73 mm from the surface level of the melt.

Figure 5:
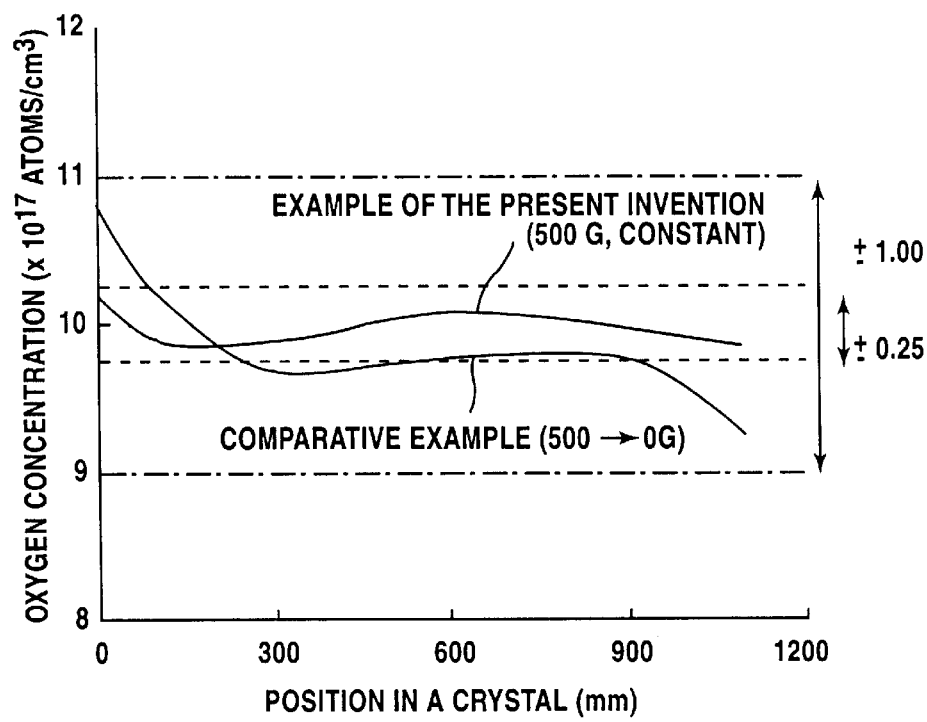
FIG. 5 shows oxygen distribution with respect to the axial direction for single crystals according to the working example of the present invention and a comparative example.

As is clear from FIG. 5, the oxygen distribution with respect to the axial direction is regulated within a variation of 0.25×10$^{17}$ atoms/cm$^3$ when the standard oxygen concentration is 10×10$^{17}$ atoms/cm$^3$. Although the pulling step was repeated ten times, dislocations were not generated in a single crystal.

Comparative Example

The method disclosed in the above-mentioned Japanese Patent Application Laid-Open (kokai) No. 5-194077 was carried out. Specifically, after the main body of a single crystal having a diameter of 8 inches had been pulled, the rotation rate of a crucible was increased from 5 rpm to 10 rpm, and the intensity of the magnetic field was reduced from 500 G to 0 G. The pulling step was repeated ten times. As is clear from FIG. 5, the oxygen distribution with respect to the growth direction was regulated within the target oxygen concentration of 10×10$^{17}$ atoms/cm$^3$ ±1.0×10$^{17}$ atoms/cm$^3$. However, among the 10 single crystals produced by the pulling steps, dislocations were generated in the lower portion of the main body of three single crystals and during formation of a tail portion in one single crystal.

In the four cases of generation of dislocations, the period of application of a magnetic field during a pulling step was substantially short, and the dislocations were induced by a lowered effect on prevention of deterioration of an inner wall of a quartz crucible. Such a drawback is expected to become increasingly pronounced with future increases in the size of a crucible for pulling.

Figure 6:
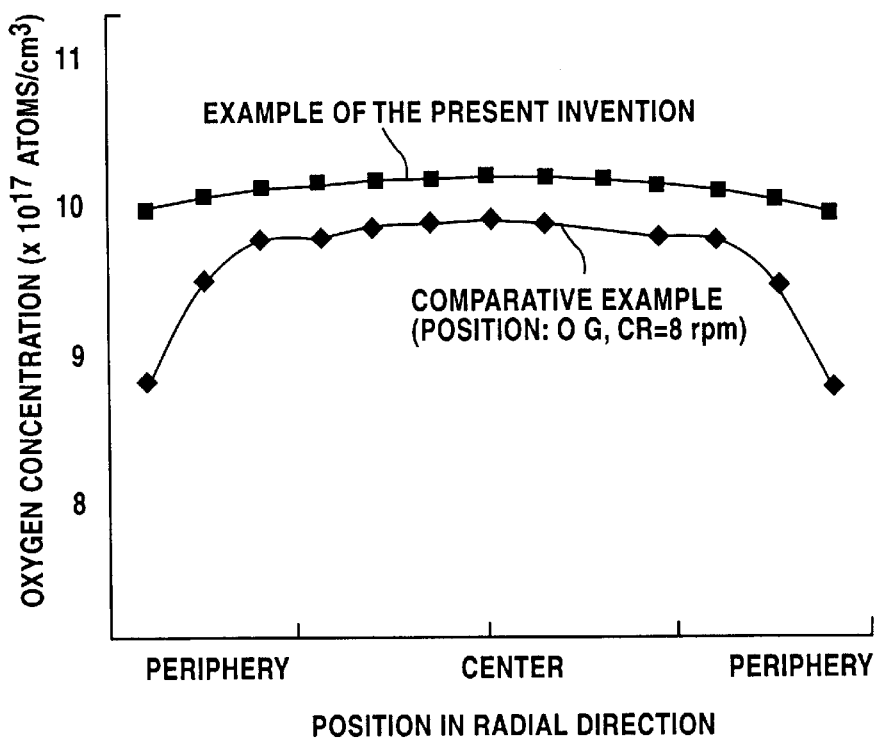
FIG. 6 shows oxygen distribution with respect to the radial direction for single crystals according to the working example of the present invention and a comparative example.

FIG. 6 shows oxygen distribution with respect to the radial direction for single crystals according to a working example of the present invention and a comparative example. The oxygen distribution in the single crystals of the Comparative Example represents radial distribution under the following conditions: a magnetic field intensity of 0 G and a crucible rotation rate of 8 rpm. As is dear from FIG. 6, the oxygen concentration decreased at the periphery of a single crystal of the Comparative Example. In contrast, the method of present invention, in which the rotation rate of a crucible does not increase, provided a single crystal having uniform oxygen distribution with respect to the radial direction, since lowering of the oxygen concentration at the periphery of a single crystal is suppressed.

The method for producing a silicon single crystal according to the present invention through a magnetic Czochralski method involving application of a cusp magnetic field provides a high-quality silicon single crystal. In the method, a mid-field position between upper and lower coils is set at a specific level from the surface level of a melt, to thereby make uniform the oxygen distribution in the single crystal with respect to the axial and radial directions and to prevent generation of dislocations.

What is claimed is:

1. A method for producing a silicon single crystal by use of a magnetic Czochralski method which involves pulling a single crystal while a cusp magnetic field is applied, wherein:
   the intensity of the cusp magnetic field and mid-field position existing between upper and lower coils are held constant during the pulling of a main body of the single crystal having a diameter corresponding to that of a wafer product; and said mid-field position is set at −40 mm to −100 mm from the surface level of a melt.

2. A method for producing a silicon single crystal according to claim 1, wherein the mid-field position is set at −7% to −18% from the surface level of the melt as normalized with respect to the distance to the inner diameter of a crucible containing the melt.

3. A method for producing a silicon single crystal according to claim 1, wherein during the pulling of the main body of the silicon single crystal the cusp magnetic field is held constant to have an intensity of 300 G to 600 G.

4. A method for producing a silicon single crystal according to claim 1, wherein during the pulling of the main body of the silicon single crystal the rotation rate of a crucible containing the melt is held constant.

5. A method for producing a silicon single crystal by use of a magnetic Czochralski method which involves pulling a single crystal while a cusp magnetic field is applied, wherein:
   the intensity of the cusp magnetic field and mid-field position existing between upper and lower coils are held constant during the pulling of a main body of the single crystal having a diameter corresponding to that of a wafer product;
   and said mid-field position is set at a specific range from the surface level of a melt; and
   the variation in oxygen concentration is 1.0×10$^{17}$ atoms/cm$^3$ or less.

6. A method for producing a silicon single crystal according to claim 5, wherein the mid-field position is set at −40 mm to −100 mm from the surface level of the melt.

7. A method for producing a silicon single crystal according to claim 5, wherein the mid-field position is set at −7% to −18% from the surface level of the melt as normalized with respect to the distance to the inner diameter of a crucible containing the melt.

8. A method for producing a silicon single crystal according to claim 5, wherein during the pulling of the main body of the silicon single crystal the cusp magnetic field is held constant to have an intensity of 300 G to 600 G.

9. A method for producing a silicon single crystal according to claim 5, wherein during the pulling of the main body of the silicon single crystal the rotation rate of a crucible containing the melt is held constant.

10. A method for producing a silicon single crystal by use of a magnetic Czochralski method which involves pulling a single crystal while a cusp magnetic field is applied, wherein:

the intensity of the cusp magnetic field and mid-field position existing between upper and lower coils are held constant during the pulling of a main body of the single crystal having a diameter corresponding to that of a wafer product;

and said mid-field position is set at a specific range from the surface level of a melt; and coils for generation of a magnetic field are disposed opposite each other above and below the crucible, so as to apply along the pulling axis an axially-symmetrical cusp magnetic field to a melt contained in the crucible.

11. A method for producing a silicon single crystal according to claim 10, wherein the mid-field position is set at −40 mm to −100 mm from the surface level of the melt.

12. A method for producing a silicon single crystal according to claim 10, wherein the mid-field position is set at −7% to −18% from the surface level of the melt as normalized with respect to the distance to the inner diameter of a crucible containing the melt.

13. A method for producing a silicon single crystal according to claim 10, wherein during the pulling of the main body of the silicon single crystal the cusp magnetic field is held constant to have an intensity of 300 G to 600 G.

14. A method for producing a silicon single crystal according to claim 10, wherein during the pulling of the main body of the silicon single crystal the rotation rate of a crucible containing the melt is held constant.

* * * * *